United States Patent [19]

Class et al.

[11] 4,428,816

[45] Jan. 31, 1984

[54] FOCUSING MAGNETRON SPUTTERING APPARATUS

[75] Inventors: Walter H. Class, Yonkers; Robert G. Hieronymi, Sloatsburg, both of N.Y.; Steven D. Hurwitt, Park Ridge, N.J.

[73] Assignee: Materials Research Corporation, Orangeburg, N.Y.

[21] Appl. No.: 497,798

[22] Filed: May 25, 1983

[51] Int. Cl.$^3$ .............................................. C23C 15/00
[52] U.S. Cl. .................................. 204/298; 204/192 R
[58] Field of Search ............................ 204/298, 192 R

[56] References Cited

U.S. PATENT DOCUMENTS

| | | | |
|---|---|---|---|
| 3,878,085 | 4/1975 | Corbani | 204/298 |
| 4,162,954 | 7/1979 | Morrison | 204/298 |
| 4,169,031 | 9/1979 | Brors | 204/298 |
| 4,265,729 | 5/1981 | Morrison | 204/298 |
| 4,282,083 | 8/1981 | Kertesz et al. | 204/298 |
| 4,312,731 | 1/1982 | Morrison | 204/298 |

Primary Examiner—Arthur P. Demers
Attorney, Agent, or Firm—Kenyon & Kenyon

[57] ABSTRACT

A cathode assembly for use in a magnetron sputtering system, the system having a cathode assembly with parallel elongated target segments which are formed substantially of a material which is desired to be sputter-deposited onto a substrate. The elongated target segments are each provided with a material removal surface which is inclined toward the other segment with respect to the plane of the substrate. Such inclination permits the material which is removed from the target bars to be focused onto a relatively narrow area, thereby improving the efficiency of the sputtering operation and reducing machine down-time for cleaning and vacuum pumping. End target segments are provided for improving the efficiency of film deposition near the ends of the elongated bars. The end target segments are provided with material removal surfaces which are also inclined, and connect with the elongated target segments to form a rectangular frame arrangement. An elongated inner pole piece has outwardly extending portions near each end to improve uniformity of a trapping magnetic field between the inner pole piece and a rectangular annular outer pole piece.

19 Claims, 6 Drawing Figures

FOCUSING MAGNETRON SPUTTERING APPARATUS

BACKGROUND OF THE INVENTION

This invention relates generally to sputtering systems, and more particularly, to magnetically enhanced sputtering apparatus having an elongated target arrangement.

The application of magnetic field enhancement to an elongated cathode configuration in a gas discharge sputtering device is described in U.S. Pat. No. 3,878,085, which issued to J. F. Corbani on Apr. 15, 1975. Corbani confirms the discovery reported in U.S. Pat. No. 2,146,025 of Penning that the power consumption of a sputtering system can be greatly reduced, and the quality and deposition rate of the coating on a substrate improved, by magnetically retaining the electrons of the gas discharge in a region near the cathode of the sputtering system. In the Corbani apparatus, retention is achieved by providing a tunnel-like magnetic field adjacent to the target surface in which the charged particles move.

When the tunnel-like magnetic field is made to close on itself to form a closed loop adjacent to the sputtering target surface, the sputtering process becomes very efficient because the electrons can no longer escape from the ends of the tunnel. Sputtering methods using the closed loop approach have been given the name "magnetron sputtering," and the surface of the cathode enclosed by the magnetic tunnel is called the "race-track."

Sputtered material emanates from a magnetron sputtering cathode predominantly from the race-track region. The distribution of this material is usually very non-uniform. Uniform film coating on a substrate is therefore accomplished by some means of moving the substrate, which has the effect of averaging and thereby smoothing the sputtered deposit. Thus, the practical applications of magnetron sputtering have resulted from the combination of a particular magnetic tunnel and target configuration (which defines the race-track) with an appropriate substrate motion to achieve a system providing acceptable coating uniformity. Magnetically enhanced sputtering has been the subject of extensive patent activity. (U.S. Pat. Nos. 2,146,025, 3,282,816, 3,884,793, 3,995,187, 4,030,996, 4,031,424, 4,041,353, 3,711,398, 4,060,470, 4,111,782, 4,116,793, 4,194,962, 4,166,018 and 4,198,283).

This invention relates to that type of system which combines a sputtering cathode, having an elongated closed loop magnetic tunnel which encloses a correspondingly-shaped sputtering surface (race-track), with a linear translation of the substrate past the sputtering surface.

The preferred practice regarding the use of such a cathode involves scanning the substrates past the cathode, usually in a plane parallel to the plane defined by the race-track and separated therefrom by a distance referred to as the target-to-substrate distance. Such motion is further usually directed perpendicular to the long axis of the race-track. By convention, that substrate dimension which lies in the plane of motion and extends transverse to the scanning direction is referred to as the substrate width, and that which extends parallel to the scanning direction is referred to as the substrate length.

There are two types of sputtered material loss which occur when using the above configuration. The first arises because coating uniformity requires that the long axis of the race-track exceed the width of the substrate. For example, to assure a coating thickness non-uniformity of no more than ±10% across the substrate width typically requires that the race-track length be 3" to 4" longer than this width; i.e., coating a 12" wide substrate requires a 15" to 16" long race-track region. Thus, sputtered material accumulates on apparatus components which lie opposite the target and adjacent to the width dimensions of the substrate. This constitutes a loss of sputtered material which is here referred to as target end loss.

The second type of material loss arises when a substrate of finite length is to be coated. Here, a common practice consists of positioning the substrate leading edge immediately adjacent to the deposition zone of the sputtering target. Sputtering is then commenced and scanning motion of the substrate initiated. This process is maintained until the trailing edge of the substrate clears the deposition zone. If the deposition zone of the cathode has a lenght l, measured in the scan direction, and the substrate has a length L, then the total distance traversed by the substrate is the distance l+L. However, during part of this process, the substrate does not cover the deposition zone, so sputtered material deposits onto parts of the sputtering machine in front of or behind the substrate. The fraction of material thus lost is given by the ratio $l/(l+L)$. This loss (called an overscan loss) can be minimized by reducing l, the length of the film deposition zone produced by the cathode.

Both overscan losses and target end losses cause sputtered material accumulation on apparatus components. This requires frequent process interruption for removing the unwanted material and subsequent cleaning of the apparatus components.

The principal object of this invention is to provide a cathode which focuses the sputtered material emanating from an elongated race-track region to reduce the length of the deposition zone, thereby reducing overscan losses, and also to reduce the width of the deposition zone, thereby minimizing target end losses. In addition, since focusing decreases the area over which deposition occurs, the deposition rate in the smaller resulting deposition zone of the target is correspondingly increased.

It is known that the incorporation of residual gas contaminants in the coating is controlled by the mathematical relationship R/P, where R is the film deposition rate, and P is the residual gas pressure. Thus, an increase in deposition rate R which results from the above focusing permits an increase in the allowable residual gas pressure P without exceeding acceptable limits of coating impurity. The increase in allowable residual gas pressure P permits the use of lower quality vacuum pumping equipment and shorter pump-down times prior to starting deposition, and it generally makes the coating process more tolerant to small air leaks in the sputtering system. This advantage is especially important in the deposition of aluminum and its alloys in the manufacture of semiconductor integrated circuits, which deposition is adversely affected by sputtering system residual gas contamination.

A further advantage of such focusing is that it reduces waste of sputtering material, by reducing the amount of material deposited onto the structural components of the sputtering machine, and reduces system down-time for cleaning and vacuum pump-down time prior to operation of the system.

SUMMARY OF THE INVENTION

The foregoing and other objects are achieved by providing a cathode assembly for use in a magnetron sputtering apparatus, the assembly being adapted to be mounted in an evacuable chamber opposite a substrate plane and including an elongated annular sputtering target which has a sputtering surface composed of a material to be deposited on a substrate disposed at the substrate plane and a contact surface opposite the sputtering surface, a target support, means for clamping the sputtering target with said contact face in thermal and electrical contact with the target support, and a magnet arrangement positioned near the sputtering target for providing a closed-loop tunnel-shaped magnetic field enclosing the sputtering surface of the sputtering target, wherein the sputtering target comprises first and second elongated side portions and first and second end portions each of said side and end portions having an inner peripheral edge and an outer peripheral edge and said portions being arranged as a rectangular frame, the sputtering surfaces of the side portions and the end portions being generally flat and respectively inclined toward each other, and the contact surfaces of the side and end portions being approximately flat and parallel to the respective sputtering surfaces of said portions; and the means for clamping the sputtering target in contact with the target support comprises means forming an annular pole piece of magnetically permeable metal; means forming an elongated inner pole piece of magnetically permeable metal, said elongated inner pole piece having a portion adjacent to each end of the inner pole piece extending in front of the inner edge of the sputtering surface of the adjacent end target portion such that the diagonal air gap distance between each end portion of the inner pole piece and the adjacent corners of the outer pole piece is approximately equal to the transverse air gap distance between the inner pole piece and the outer pole piece intermediate the ends of the inner pole piece.

In an actual embodiment of the invention in which the sputtering surfaces of the first and second target segments were inclined at an angle of 45° to the plane of the target frame, the length of the sputtered material deposition pattern in the scan direction, at the appropriate target-to-substrate spacing, was reduced to approximately three inches from the approximately six inches obtained from a four-segment target frame of the same dimensions in which the sputtering surfaces were not inclined with respect to the plane of the frame (i.e., a planar target). Both target arrangements were tested in a sputtering system designed to coat a twelve inch long substrate, or an array of substrates which lie on a twelve inch long tray, known as a pallet. By substituting the tilted-face target for the planar target, overscan losses were reduced from 33% to less than 12%.

Inward inclination of the sputtering surfaces of the third and fourth target segments has the advantage of concentrating the sputtered material in the dimension transverse to the scan direction, thereby minimizing the aforementioned target and losses. In the same embodiment described above, the cathode produced a deposition zone width of twelve and one quarter inches as compared with sixteen inches for a planar cathode of equivalent dimensions. Since the substrate width coated by means of this cathode was twelve inches, end losses were therefore substantially reduced.

A further aspect of the invention is dictated by the close approach of the tilted target segments to the substrate scanning plane. In the above-identified embodiment, the shortest distance from target segment to substrate plane is approximately one-half inch. Although the gas discharge is normally confined close to the target surface by the magnetic field, the close substrate to target spacing can cause an appreciable bombardment of the substrate by discharge particles, particularly high energy electrons, resulting in an unacceptable degree of substrate heating.

The problem is avoided by placing an electron capture shield between the target plane and the substrate plane. This shield is maintained at anode potential and is positioned to intercept some of the magnetic flux lines from the cathode. Since electrons tend to escape from the discharge by moving along magnetic field lines, this shield placement has the effect of removing electrons prior to their bombarding the substrate. A cooler deposition is thereby maintained.

A mathematical model has been developed to simulate deposition patterns for a variety of focused geometries. Surprisingly, the resulting data have been in good agreement with prediction only near the ends in the longitudinal target dimension but not in agreement across the narrow dimension of the target. It is believed that additional material which is deposited at the periphery of the deposition pattern may result from a reflection-like mechanism during the sputtering operation. That is, material impinging on a target face from a facing target face, possibly at a shallow grazing angle, is reflected or remains loosely bound until a subsequent sputtering event dislodges it.

As a result of the nearly closed geometry which is formed by the combination of the cathode, electron capture shielding, and close-in pallet spacing in this preferred embodiment, a high degree of sputtering material conservation is achieved. Virtually all material which is not subject to overscan losses ends up at the pallet, on the dark space shield, or deposited on a facing cathode member. From one test it was determined that 90% of the sputtering material was deposited on the substrate plane, 9% was deposited on the electron capture shielding, and 1% ended up on non-active members of the cathode or dispersed throughout the sputtering chamber. The amount of scattered material was reduced by greater than an order of magnitude from that in existing sputtering systems, resulting in reduced maintenance requirements and cleaner machine operation.

BRIEF DESCRIPTION OF THE DRAWINGS

The invention is further explained in the following detailed description in conjunction with the annexed drawings in which.

DETAILED DESCRIPTION

Early investigations of the sputtering process have shown that in most cases the spatial distribution of the sputtered atoms ejected from a sputtering target obey Knudsen's Cosine law. This law states that the flux of atoms dm, emanating from a point source on a sputtering surface and passing through a solid angle dw is determined by the relation:

$$dm = k \cos \phi \, dw$$

where $k$ = a constant $\phi$ = the angle between the normal to the surface and the direction in which the flux is measured.

The flat sputter targets used in diode sputtering can, therefore, be considered as a planar array of point sources, each of which emits sputtered atoms according to the above law. A planar magnetron target, on the other hand, does not behave as a planar array of point sources, since sputtering is confined to the race-track region of the target. Instead, the planar magnetron target behaves more as a linear array of point sources, the linear array being determined by the shape of the race-track.

From this combination of the cosine distribution law and the linear nature of the magnetron source, it can be shown that if the sputtering surfaces underlying two long sides of a race-track region are tilted toward each other, the sputtered atoms emitted from various points along the line source can be made to converge to a narrow deposition zone with correspondingly increased deposition rate.

Figure 1:
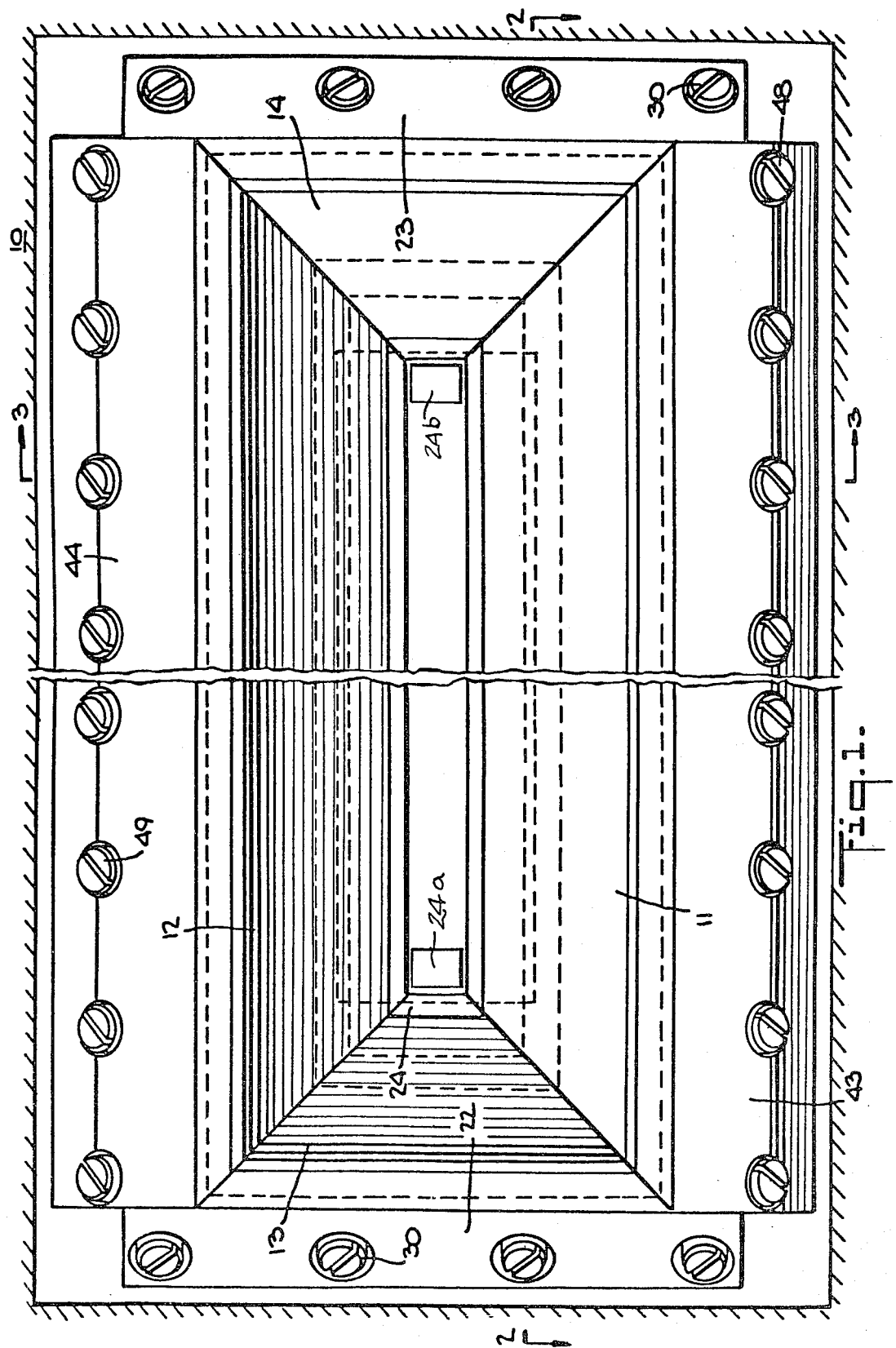
FIG. 1 is a plan view of a cathode assembly for a magnetron sputtering apparatus in accordance with the principles of the invention.

FIG. 1 shows a plan view of a cathode assembly which is generally designated by reference number 10, having a pair of longitudinal target segments in the form of bars 11 and 12, and a pair of end target segments in the form of bars 13 and 14. Target bars 11, 12, 13 and 14, are formed, at least partially, of a material which is to be sputter-removed from the target bars and deposited onto a substrate 15 transported past the cathode assembly on a wheeled-pallet 15a (see FIG. 3). The target bars have mitered ends so as to form a rectangular, frame-like arrangement. Although the segments are easier in most cases to manufacture as separate bars, the target can also be made as a one-piece frame-like structure, if desired.

Figure 2:
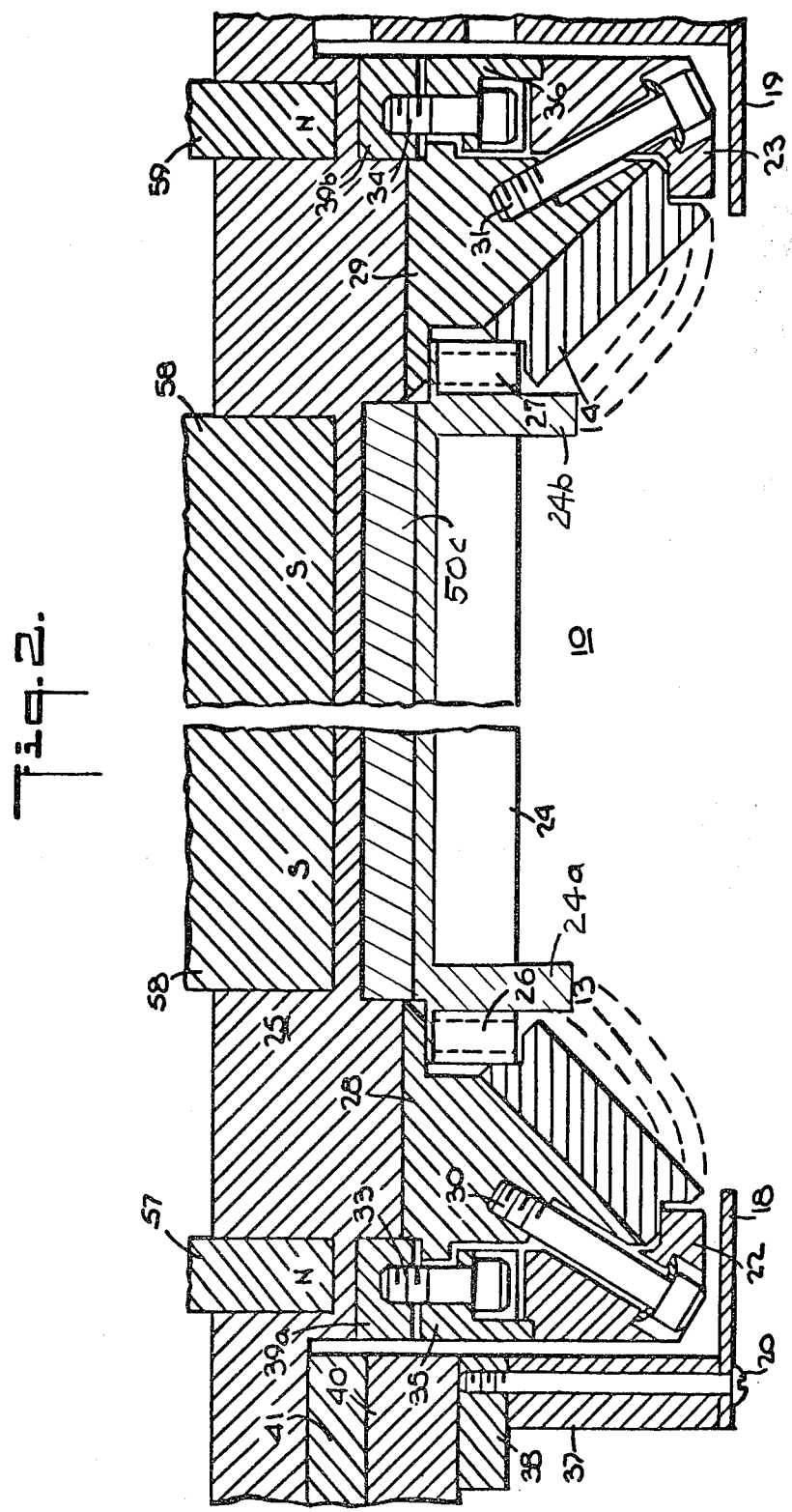
FIG. 2 is a cross-sectional representation of the embodiment of FIG. 1 taken along line 2—2.
Figure 3:
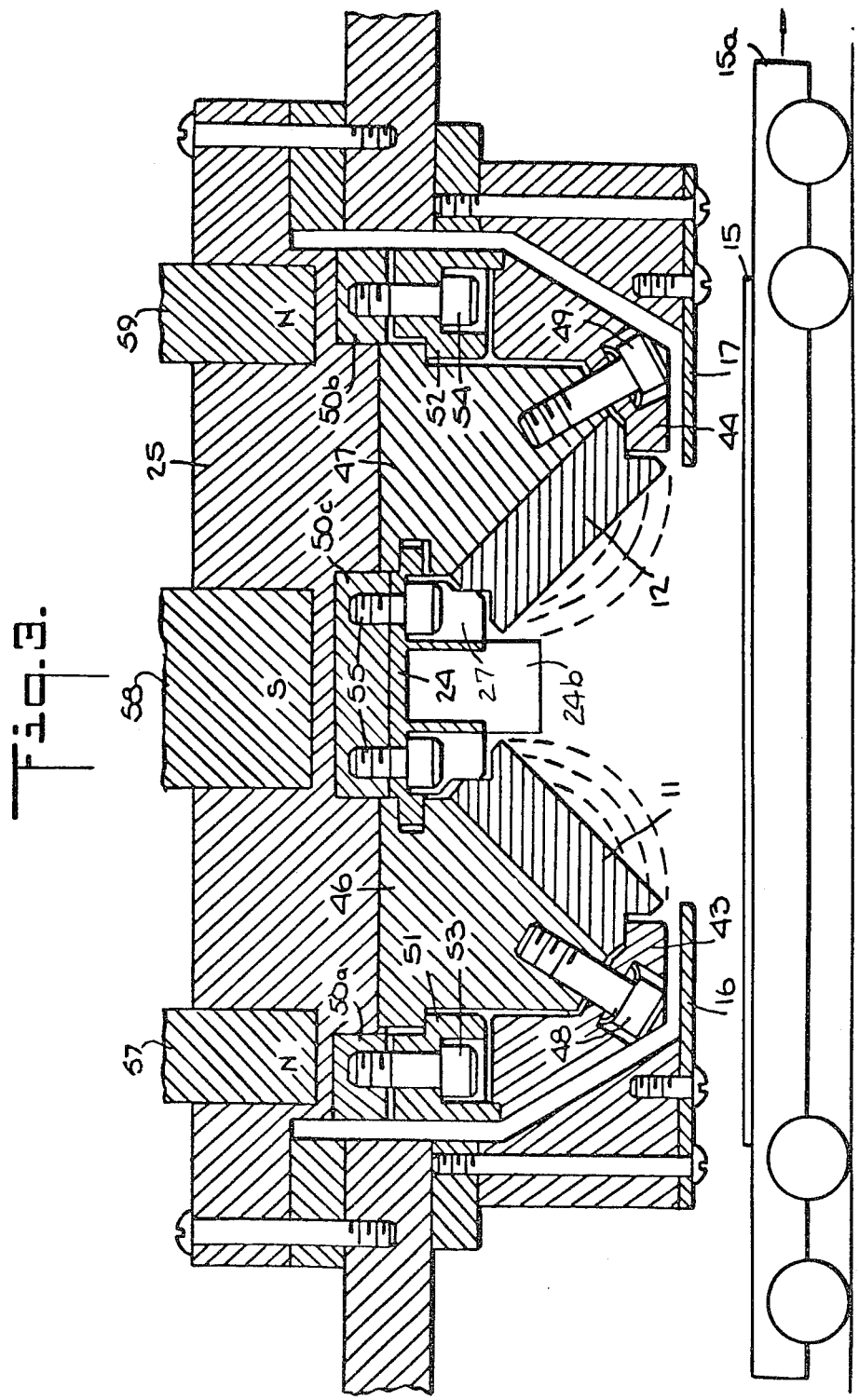
FIG. 3 is a cross-sectional representation of the embodiment of FIG. 1 taken along line 3—3.

It is desirable to prevent contamination by a film deposited on the substrate by material which is sputter-removed from non-target parts of the cathode, such as structural elements which hold the target bars to the cathode assembly. In this embodiment, such contamination is prevented by electron capture shields 16, 17, 18 and 19, which, as shown in FIGS. 2 and 3, are disposed near target bars 11, 12, 13 and 14, respectively. The electron capture shields are formed of non-magnetic metallic material and are maintained at or near anode (i.e., ground) potential. Thus, a large voltage differential exists between the target bars and the electron capture shields. The electron capture shields are attached to the grounded chamber wall by a plurality of screws 20, as shown in FIGS. 2 and 3.

FIG. 2 is a cross-sectional view of the cathode assembly taken along line 2—2 of FIG. 1. FIG. 2 shows end target bars 13 and 14 held in position by magnetically soft clamp pieces 22 and 23, respectively. A magnetically soft central pole piece 24, which is arranged adjacent to cover plate 25, cooperates in holding end target bars 13 and 14 in position. Central pole piece 24 is provided with bores 26 and 27 (shown in phantom) at respective flange portions for passing connection bolts (not shown in this figure) which engage water-cooled cover plate 25. End target bar 13 rests in contact with a non-magnetic support base 28 which is held to water-cooled cover plate 25 by a bolt 33 and magnetically soft clamp 35. Bolt 33 engages a magnetically soft pole piece 39a brazed into water-cooled cover plate 25. A non-magnetic bolt 30 maintains the magnetically soft clamp 22 in contact with end target bar 13, thereby urging it into intimate contact with support base 28. Pole piece 39a plus clamps 35 and 22 cooperate to provide a path of low magnetic reluctance from north magnet pole 57 to the surface of target bar 13. Magnetic field lines, indicated by dashed lines, therefore extend from clamp 22 to pole piece 24, which is positioned adjacent to south magnet pole 58. In a similar fashion, a non-magnetic support base 29, upon which end bar 14 rests, is held against water-cooled cover plate 25 by a bolt 34 and magnetically soft clamp 36. Bolt 34 engages a magnetically soft pole piece 39b brazed into water-cooled cover plate 25. A non-magnetic bolt 31, maintains the magnetically soft clamp 23 in contact with target bar 14, thereby urging it into intimate mechanical and thermal contact with support base 29. Pole piece 39b plus clamps 36 and 23 cooperate to provide a path of low magnetic reluctance from north magjnet pole 59 to the surface of end target bar 14. Magnetic field lines, indicated by dashed lines, therefore extend from clamp 23 to pole piece 24, which is positioned adjacent to south magnet pole 58.

Electron capture shields 18 and 19 are each affixed by means of screws 20 extending through a stand-off 37 to a spacer 38 which is brazed or otherwise fastened to a top wall 40 of an evacuable chamber (not specifically designated) in which the deposition operation takes place. Top wall 40 is provided with an insulated layer 41 containing O-ring seals (not shown) for preventing leaks. The opening in top wall 40 of the evacuable chamber, through which cathode assembly 10 accesses the evacuable chamber, is closed by cover plate 25 which rests upon and seals to insulating layer 41. Insulator 41 prevents electrical contact between top wall 40, which in this embodiment, is at anode potential, and cover plate 25, which is at cathode potential.

FIG. 3 is a transverse cross-sectional representation of cathode assembly 10 taken along line 3—3 of FIG. 1. The figure shows longitudinal target bars 11 and 12 held in place between central pole piece 24 and soft magnetic clamp pieces 43 and 44, respectively. Longitudinal target bar 11 is in contact with non-magnetic support base 46. Non-magnetic bolt 48 causes clamp 43 to urge target bar 11 into intimate mechanical and thermal contact with support base 46. Similarly, non-magnetic bolt 49 causes clamp 44 to urge target bar 12 into intimate thermal and mechanical contact with support base 47.

A pair of longitudinal, soft magnetic clamps 51 and 52 are mechanically connected by bolts 53 and 54 to pole pieces 50a and 50b, which are brazed into water-cooled cover plate 25. Similarly, pole piece 24 is connected by bolts 55 to pole piece 50c, which is brazed into water cooled backing plate 25. The combined action of the clamps, bolts, and brazed pole pieces is to hold support bases 46 and 47 in intimate thermal contact with water cooled cover plate 25.

Soft magnetic pole piece 50b cooperates with soft magnetic clamps 52 and 44 to provide a path of low magnetic reluctance between north magnet pole 59 and the surface of longitudinal target bar 12.

Similarly, pole pieces 50c and 24 provide a path of low magnetic reluctance between south magnet pole 58 and the surface of longitudinal target bar 12. As a consequence, magnetic field lines, indicated by dashed lines, extend from clamp 44 to pole piece 24, and therefore form an arch across the surface of longitudinal target bar 12.

In like manner, the soft magnetic pole piece 50a cooperates with soft magnetic clamps 51 and 43 to provide a path of low magnetic reluctance between north magnet pole 57 and the surface of longitudinal target bar 11. Magnetic field lines, indicated by dashed lines, extend from clamp 43 to pole piece 24, and therfore form an arch across the surface of longitudinal target bar 11.

The arch shaped magnetic field lines over longitudinal target bars 11 and 12, cooperate with similar magnetic field lines over end target bars 13 and 14, to provide the arched, closed loop magnetic field required for efficient magnetron sputtering of the target bars.

An important feature that contributes to stabilizing the plasma and reducing overscan losses is the provision adjacent to each end of the inner pole pieces 24 of a portion 24a, 24b extending in front of the inner edge of the adjacent target end bar. Without such extended portions it has been found that the plasma tends to be unstable at the corners of the target. By reference to FIG. 1, it can be seen that the diagonal air gap distance between the inner and outer pole pieces at the corners of the target assembly is significantly greater than the transverse air gap distance between the inner and out pole pieces intermediate the ends of the inner pole piece. It is postulated that instability in the corner regions of the plasma is due to weaker magnetic field density in these regions due to the longer diagonal air gap. The portions 24a and 24b extend such that the diagonal air gap distance in each corner is approximately equal to the transverse air gap distance. This arrangement eliminates any tendency toward instability of the plasma. Surprisingly, it also produces a significant reduction in overscan loss, although the reason for this is not fully understood.

The magnet poles 57, 58 and 59, may be formed by either electromagnets or permanent magnets. Either configuration is equally effective in achieving the desired magnetic field configuration adjacent to the target bars.

Two trail embodiments of the invention have been constructed and operated, in which the target bars were tilted inwardly 30° and 45°, respectively, to a plane parallel to the substrate plane. The width of the sputtering face of each long bar was about 1½ inch, and the spacing between the upper edges was about ¾ inch. The length of the long bars was about 12 inches, but their length may be typically from about 6 inches to about 30 inches, depending on the sputtering chamber and substrate dimensions.

Figure 4:
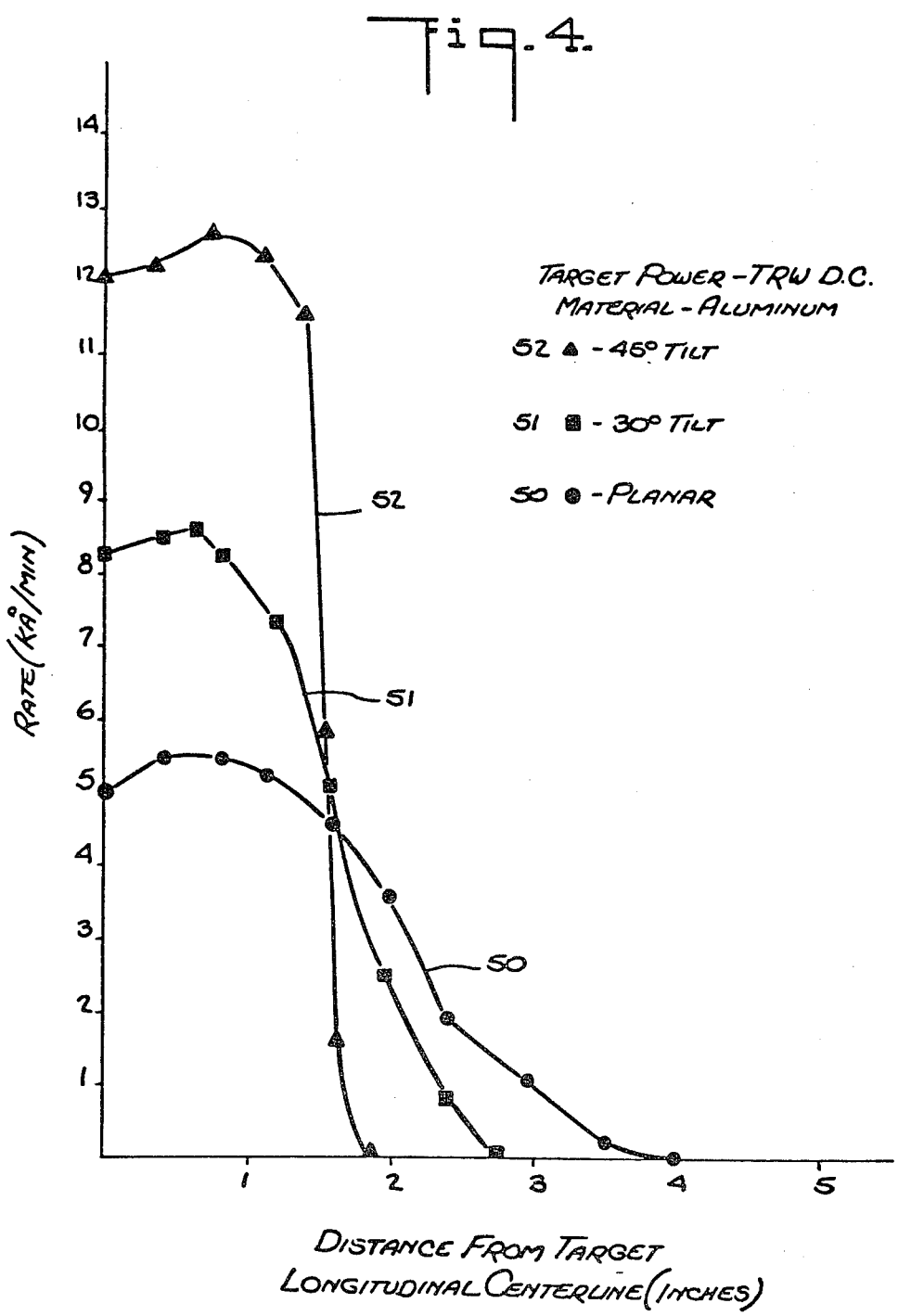
FIG. 4 is a graph which compares the rates and cross-sectional profiles of film deposition for several sputtering surface configurations.

FIG. 4 is a compound graph which illustrates the relationship between the rate of film deposition in units of kiloangstroms/min (kA/Min) measured vs. the distance from the longitudinal centerline of the target assembly. The cathode was operated at 7 kw DC power, and the rate measurements were made at the substrate plane.

Plot 60 in FIG. 4 shows a film growth rate profile for a conventional planar target arrangement in which the material removal surface is parallel to the substrate plane. The specific target arrangement consisted here of four target bars in a rectangular frame, but single-plate planar targets will yield substantially identical results. A nominal two-inch target-to-substrate distance was used to generate plot 50.

Plot 61 of FIG. 4 shows a film growth rate profile in which all four target bars were inclined inwardly by 30°. The length and width of the race-track remained approximately the same as in the previous case. However, because of the tilting, the target to substrate distance can not be defined by a single dimension. Plot 61 of FIG. 4 was obtained at a closest spacing between substrate plane and tilted bar of 1⅛ inches. It should be noted that the width of the deposition zone was reduced from approximately eight inches for the planar case to five and one half inches. The peak film deposition rate was also increased from 5.5 kA/Min to Plot 62 of FIG. 4 shows a film growth rate profile for an arrangement in which all four target bars were inclined inwardly by 45°. In this case, closest spacing between tilted bar and substrate plane was approximately one-half inch. It should be noted that the deposition zone width is further reduced to a width of three and one-half inches. The peak film deposition rate has been increased to 12.5 kA/Min. It can be seen from this comparison that substantial narrowing of the deposition zone and increase in the peak film deposition rate is achieved with the inventive tilted bar concept.

The embodiment of FIGS. 1-3 is effective in accomplishing the principal objects of the invention, as demonstrated by the comparative test results shown in FIG. 4. In an alternative embodiment illustrated in FIGS. 5 and 6, several structural changes in the cathode assembly provide substantially improved cooling of the targets, which allows operation at increased power, and an improved magnetic field configuration, which eliminates unstable operation at such higher powers and also permits an approximately 10 percent reduction in target area while maintaining deposition uniformity over the same substrate width.

In the first embodiment, the target bars are clamped indirectly to the water-cooled cover plate 25 via nonmagnetic support bases 28, 29, 46, and 47 of approximately triangular cross section. As shown in FIGS. 2 and 3, this arrangement requires sets of tandem clamping bars, one bar of each set to clamp a support base to the water-cooled cover and the other bar to clamp the outer edge of the corresponding target bar to the support base.

The interface between the water-cooled cover plate and each support base creates a high resistance barrier to heat transfer. The tandem clamping bars also serve as pole pieces to extend the magnetic path to the outer edges of the target bars, and the subdivision of these pole pieces into separate bars reduces their magnetic effectiveness.

Figure 5:
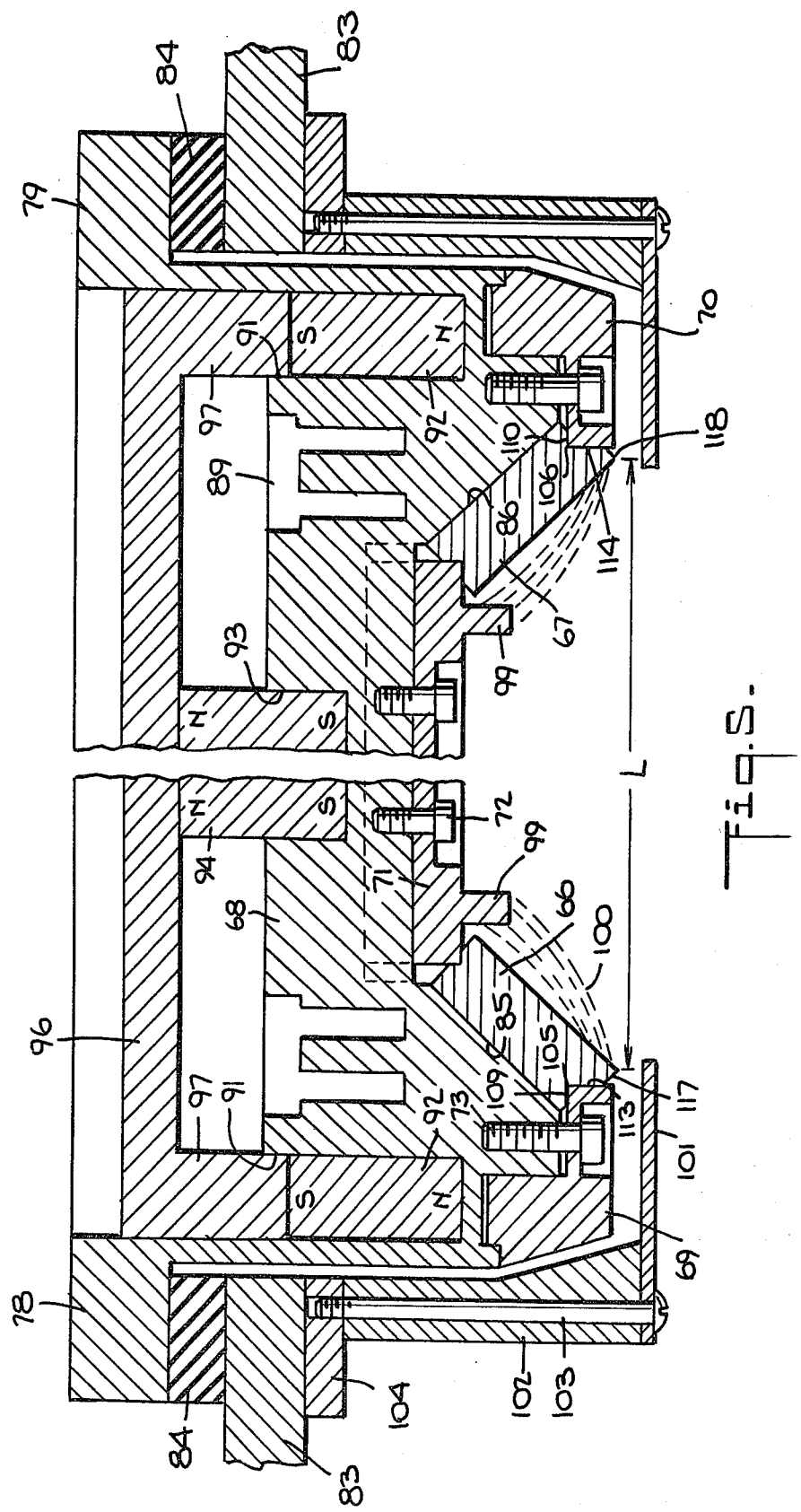
FIG. 5 is a longitudinal cross-sectional repesentation, corresponding to FIG. 2, of an alternative embodiment of a cathode assembly in accordance with the principles of the invention.
Figure 6:
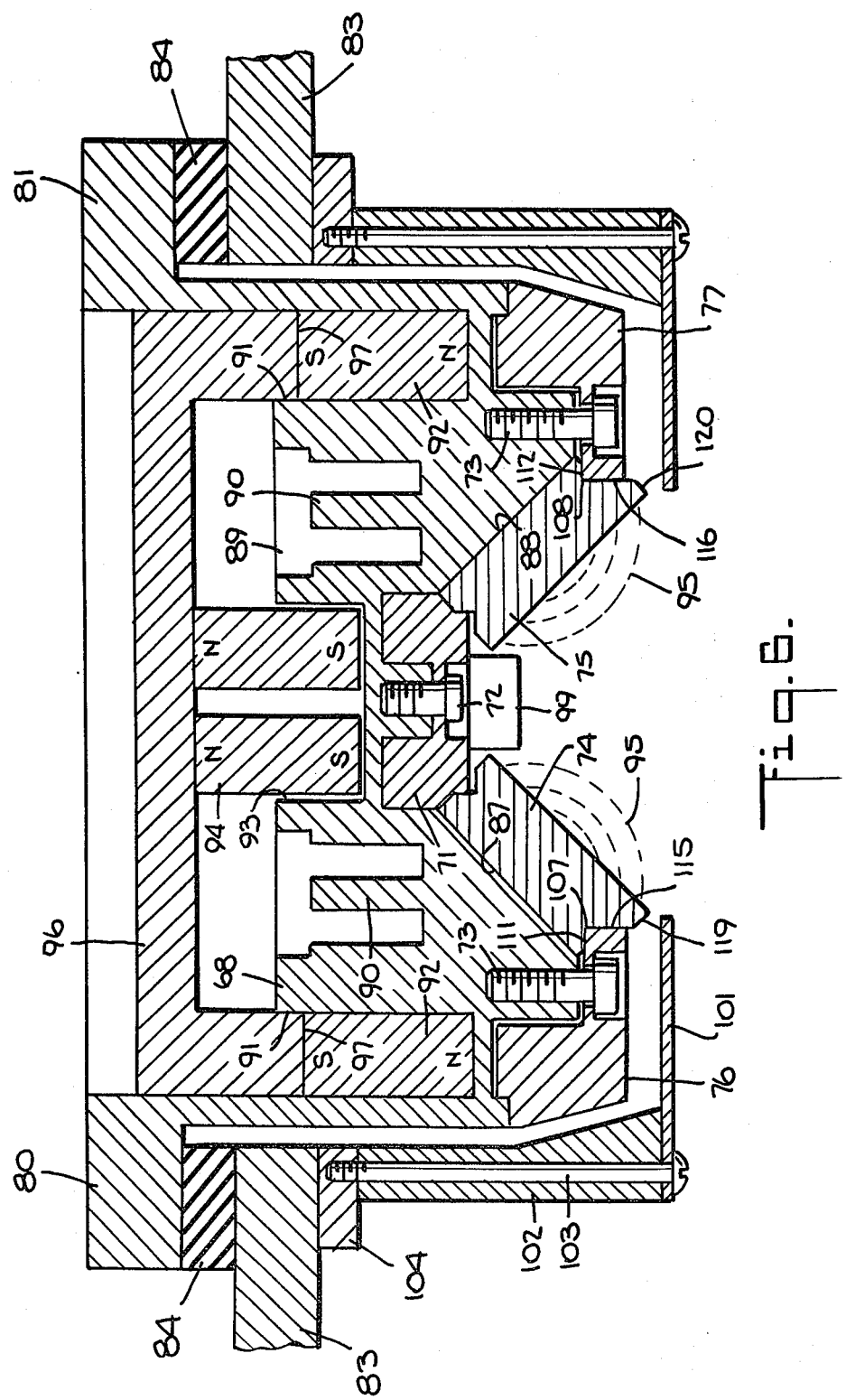
FIG. 6 is a transverse cross-sectional representation, corresponding to FIG. 3, of the embodiment of FIG. 5.

The alternative embodiment shown in FIGS. 5 and 6 simplifies both the thermal and magnetic structures of the cathode assembly. With reference to FIG. 5, which shows a longitudinal cross section corresponding to the view of FIG. 2, target end bars 66 and 67 are clamped directly to a one-piece water-cooled cover plate 68 by outer edge end clamping bars 69 and 70 and by the ends of an elongated inner edge clamping bar 71. The inner and outer edge clamping bars are fastened to the cover plate by nonmagnetic cap screws 72 and 73, respectively.

As shown in FIG. 6, which is a transverse cross section of the alternative embodiment corresponding to the view of FIG. 3, side target bars 74 and 75 are similarly clamped to the cover plate 68 by outer edge side clamping bars 76 and 77 and by the sides of the inner edge clamping bar 71.

The water-cooled cover plate is made of non-magnetic metal having good heat conductivity, such as copper. It is in the general form of a rectangular dish having end flanges 78 and 79 and side flanges 80 and 81 forming a continuous rim for mounting the cover plate in a rectangular opening 82 in the top plate 83 of a sputtering chamber via a rectangular insulator ring 84. Conventional clamps and seals (not shown) are used to provide a vacuum-tight mounting without electrical connection between the grounded chamber and the cover plate of the cathode assembly.

The underside of cover plate 68 has a central groove in the form of an inverted trough having slanted ends 85, 86 and slanted sides 87, 88 that serve as thermal and electrical contact surfaces for the rear (unexposed faces of the respective end and side target bars 66, 67 and 74, 75. The upper side of the dished portion of the cover plate contains an annular groove or channel 89 for circulating cooling water supplied to one end of the cover plate and exhausted from the other end via conduits (not shown). Channel 89 is subdivided by a vertical fin 90 to provide additional heat transfer surface for contact with the circulating cooling water, and the channel is covered by a sealing plate (not shown) to keep the cooling water inside the channel and away from contact with the magnet structure.

An additional rectangular annular groove 91 is formed in the upper side of the dished portion adjacent to the side wall of the cover plate, outside the cooling water channel. Bar magnets 92 are placed in groove 91 to provide a perimetrical rectangular annular magnet. Magnets 92 are separated by only a thin wall of nonmagnetic metal from the outer clamping bars 69, 70 and 76, 77. These clamping bars are made of magnetically permeable material, such as SAE 1018 steel, so that a low reluctance magnetic path is provided from the outer ring of magnets 92 to the outer edges of the target bars.

Similarly, a central longitudinal groove 93, shallower than the annular groove 91, is formed along the midline of the upper surface of the dished portion of plate 68, inside the cooling water channel. Bar magnets 94 are disposed in this central groove, with their polarity arranged oppositely to the polarity of magnets 92. Thus, if magnets 92 are disposed with their N poles at the bottom of groove 91, magnets 94 should be placed with their S poles at the bottom of groove 93.

As with magnets 92, only a thin wall of nonmagnetic metal (see FIG. 6) separates magnets 94 from inner clamping bar 71, which is preferably made of the same magnetically permeable metal as the outer clamping bars. Thus, a low reluctance magnetic path is also provided from magnets 94 to the inner edges of the target bars.

By comparing FIG. 6 with FIG. 3, it is apparent that use of the one-piece cover plate 68 in FIG. 6, to directly support the target bars for increased heat transfer also permits the outer magnets 92 to be placed close to the outer edge clamping bars, in the space required by the support base clamping bars in FIG. 3. Elimination of the separate support bases and their clamping bars simplifies construction and significantly reduces the length of the path from the outer magnets to the faces of the target bars. The shorter path length and the elimination of two interfaces between the magnets and the outer edge clamping bars both act to decrease the total reluctance of the path and to consequently increase the field strength at the outer edges of the target bars.

In addition, it should be noted that the notches in the outer edge of the target bars of FIG. 6 are off-center toward the rear faces, and that the contacting edges of clamping bars 76 and 77 are modified from the design of clamping bars 43 and 44 in FIG. 3 to conform to the changed notch location. The reshaping of the target and clamping bars in this way more effectively "hides" the clamping bar pole pieces from the plasma generated in front of the targets in the region indicated by dashed magnetic field lines 95.

To complete the magnetic circuit, a keeper plate 96 is placed over the dished portion of the cover plate 68. The under surface of keeper plate 96 has a peripheral rim 97 that fits into annular groove 91 of the cover plate, with the bottom of the rim contacting the tops of outer magnets 92, and the undersurface of the keeper plate contacting the tops of inner magnets 94. The keeper plate is made of magnetically permeable material, such as the material of the clamping bar pole pieces.

Conventional means, such as bolts, for fastening the keeper plate 96 to cover plate 68 are not shown, to simplify the drawings.

With particular reference to FIG. 5, the disclosed alternative embodiment also includes the feature of providing extended portions at each end of the inner pole piece. This feature permits a reduction of at least 5 percent in the target length dimension, in comparison with an inner pole piece without such extensions, with no increase in end losses and no degradation of deposition uniformity over the same substrate width.

The total length dimension of the target is the distance between the lower edges of the exposed faces of the end target bars, indicated by dimension L in FIG. 5. As described earlier, a substrate is sputter coated by scanning a support pallet in a direction normal to the longitudinal dimension of the target (i.e., normal to the plane of FIG. 5). The location of the pallet below the target is as shown in FIG. 2.

For maximum deposition efficiency, the target length L should equal the pallet width W, since this would minimize end losses of the sputtered material. This cannot be achieved in practice because the film deposition rate is not constant all the way to the ends of the target. To have acceptable film uniformity (e.g., thickness variation less than 5 percent from the mean), the target must be longer than the width of the pallet, as previously explained. For example, in the arrangement of FIGS. 1–3, it has been found necessary to make the L dimension approximately 14¾ inches (37.5 cm) to maintain a film deposition rate within ±5 percent on a 12 inch (30.5 cm) pallet.

In the embodiment of FIGS. 5 and 6, the inner clamping bar 71 is provided with a pole piece appendage 99 adjacent to each end of the bar. Each appendage 99 is in the form of a depending bar or rib extending transversely to the longitudinal dimension of the clamping bar. The appendages effectively extend the ends of the inner clamping bar pole piece 71 slightly below the inner edges of the end target bar sputtering faces. Their effect, in conjunction with the outer end clamping bar pole pieces 69 and 70, is to approximately equalize the air gap distance around the target, between the inner and outer pole pieces. The result is a more concentrated plasma at the corners of the target that appears to compensate for the sputtering rate fall-off in the end regions.

By using such inner pole piece appendages to shape the magnetic fields over the end target bars, it has been possible to reduce the L dimension of the target to 13-7/16 inches (34.1 cm) while achieving the same deposition uniformity on the same 30.5 cm wide pallet. This is a reduction of slightly more than 5 percent of overall target length L. Otherwise stated, the inner pole piece appendages permit a reduction in excess target length (L−W) from 0.23 W to only 0.13 W, a reduction in excess length of more than 40 percent. Without the appendages, the same, shortened cathode structure yields a film thickness that varies between limits of ±12 percent, demonstrating the effectiveness of the appendages in improving deposition uniformity near the ends of the target.

To prevent sputtering from non-target surfaces, the cathode assembly of FIGS. 5 and 6 is provided with an electron capture shield 101 mounted on a stand-off 102 by screws 103 extending through to a spacer 104 that is brazed or otherwise fastened to the top wall 83 of the sputtering chamber in the same way as in the embodiment of FIGS. 1–3.

The possibility of lateral sputtering from the outer pole pieces is also avoided by "hiding" the outer pole piece behind the sputtering surface of the target. This is accomplished by providing clamping grooves 105, 106, 107, 108 in the outer edges of respective target bars 66, 67, 74, and 75 that are positioned closer to the contact surfaces than to the sputtering surfaces of the bars. The grooves are preferably V-shaped and have one sidewall (109, 110, 111, 112) that intersects the contact surface of the respective target bar at an angle equal to the angle between the sputtering surface and a plane defined by the outer edges of the sputtering surfaces of the target bars (i.e., a line (not shown) joining the lower corners of the target bars in FIGS. 5 and 6). The other sidewall 113, 114, 115, 116 of each V-groove intersects the outer edge 117, 118, 119, 120 of the respective target bar. As can be seen from FIGS. 5 and 6, this configuration provides a shield in front of the corresponding pole piece 66, 67, 74, 75, which pole piece does not extend below the outer edge of the sputtering surface of the target bar.

In addition to "hiding" the outer pole pieces, it can be seen that the off-center outer grooves also permit placement of the outer pole pieces to increase the concentration of the magnetic field closely adjacent to the outer edge of the sputtering surface of each target bar to help achieve the above-described improved uniformity of deposition from the edges of the target.

Although the inventive concept has been disclosed in terms of specific embodiments and applications, it is to be understood that, in light of this teaching, persons skilled in the art can make additional embodiments without departing from the scope of the claimed invention. Accordingly, it is to be understood that the drawings and description serve to illustrate the principles of the invention, and should not be construed to limit the scope thereof. In particular, although the preferred embodiment of the tilted target arrangement of the invention is in the form of four separate bars with ends mitered to fit together as a rectangular frame, the target can be made also as a one-piece rectangular unit, for example by stamping, forging, or casting.

What is claimed is:

1. A cathode assembly for use in a magnetron sputtering apparatus, the assembly being adapted to be mounted in an evacuable chamber opposite a substrate plane and including an elongated annular sputtering target which has a sputtering surface composed of a material to be deposited on a substrate disposed at the substrate plane and a contact surface opposite the sputtering surface, a target support, means for clamping the sputtering target with said contact face in thermal and electrical contact with the target support, and a magnet arrangement positioned near the sputtering target for providing a closed-loop tunnel-shaped magnetic field enclosing the sputtering surface of the sputtering target, wherein the sputtering target comprises first and second elongated side portions and first and second end portions each of said side and end portions having an inner peripheral edge and an outer peripheral edge and said portions being arranged as a rectangular frame, the sputtering surfaces of the side portions and the end portions being generally flat and respectively inclined toward each other, and the contact surfaces of the side and end portions being approximately flat and parallel to the respective sputtering surfaces of said portions; and the means for clamping the sputtering target in contact with the target support comprises means forming an annular pole piece of magnetically permeable metal;

means forming an elongated inner pole piece of magnetically permeable metal, said elongated inner pole piece having a portion adjacent to each end of the inner pole piece extending in front of the inner edge of the sputtering surface of the adjacent end target portion such that the diagonal air gap distance between each end portion of the inner pole piece and the adjacent corners of the outer pole piece is approximately equal to the transverse air gap distance between the inner pole piece and the outer pole piece intermediate the ends of the inner pole piece.

2. A cathode assembly according to claim 1, wherein each end portion of the inner pole piece comprises a transverse rib-like appendage.

3. A cathode assembly according to claim 1, wherein the target support comprises a one-piece member of nonmagnetic metal, said member having a front face and a rear face, the front face being formed with an elongated groove in the form of a trough having inclined side walls and inclined end walls closely contacting the contact surfaces of the corresponding end and side target bars.

4. A cathode assembly according to claim 3, wherein the rear face of the target support member is formed with an annular channel for circulating cooling water in the vicinity of the inclined side and the end walls of said elongated groove in the front face.

5. A cathode assembly according to claim 4, wherein the annular cooling water channel is formed with an annular fin for increasing the surface area of the support member that is exposed to the cooling water.

6. A cathode assembly according to claim 3, wherein the rear face of the target support member is formed with a rectangular annular groove circumscribing the annular cooling water channel and a central elongated groove, shallower than the rectangular annular groove; and the magnet arrangement comprises a plurality of first bar magnets arranged in said rectangular annular groove to form an annular magnet structure having a pole of a preselected one polarity disposed towards the front face of the support member and at least one second bar magnet arranged in said central elongated groove to form an elongated center magnet structure having a pole of the opposite polarity disposed towards the base of said groove in the front face of the support member.

7. A magnetron cathode assembly for use in a sputtering apparatus, the assembly including an elongated annular rectangular sputtering target which has a sputtering surface, a contact surface opposite the sputtering surface, and outer and inner peripheral edges bounding the sputtering and contact surfaces to define a pair of parallel elongated side portions joined by a pair of end portions shorter than the side portions, a target support, means for clamping the sputtering target with said contact face in thermal and electrical contact with the target support, and means for providing a closed-loop tunnel-shaped magnetic field enclosing the sputtering surface of the sputtering target including a magnet arrangement having an annular first magnetic pole of one polarity surrounding the outer peripheral edges of the sputtering target and an elongated second magnetic pole of polarity opposite to said one polarity extending adjacent to the inner peripheral edges of the sputtering target, wherein
said elongated second magnetic pole comprises an inner bar of magnetically permeable metal positioned between the side portions of the sputtering target, the bar having a first end adjacent to the inner edge of one of the end portions of the target and a second end adjacent to the inner edge of the other end portion of the target, said first and second ends of the bar each being formed with a transverse rib-like appendage disposed closely adjacent to the junction of the inner peripheral edge and sputtering surface of the corresponding end portion of the target and protruding in front of the sputtering surface of said corresponding target end portion.

8. A magnetron cathode assembly according to claim 7 wherein said annular first magnetic pole comprises an outer pole piece of magnetically permeable metal extending adjacent to the outer peripheral edge of each of the side portions and end portions of the sputtering target, each outer pole piece being disposed completely behind the plane of the sputtering surface of the corresponding side and end portion of the target.

9. A magnetron cathode assembly according to claim 8 wherein the means for clamping the target comprises means for interengaging the sides of the inner bar with the inner peripheral edges of the adjacent target side portions and means for interengaging the ends of the inner bar with the inner peripheral edges of the adjacent target end portions.

10. A magnetron cathode assembly according to claim 8 wherein the means for clamping the target comprises means for interengaging the outer peripheral edge of each of the side and end portions of the sputtering target with the adjacent outer pole piece.

11. A magnetron cathode assembly according to claim 10 wherein the means for interengaging the outer peripheral edge of each of the side and end portions of the sputtering target with the adjacent outer pole piece comprises a groove formed in the outer edge of each of said side and end portions, the center of the grove being located closer to the contact surface than to the sputtering surface of the target, and a side wall of the groove intersecting the contact surface such that the width of the contact surface is less than the width of the corresponding sputtering surface of each target and end portion, and the adjacent outer pole portion comprises an inner edge portion that mates with said groove.

12. A magnetron cathode assembly according to claim 11 wherein said groove formed in the outer edge of each of said side and end portions of the sputtering target comprises a V-shaped groove.

13. A magnetron cathode assembly according to claim 7 wherein the sputtering surface and contact surface of each side portion and end portion of said sputtering target are approximately planar and parallel to each other; the sputtering surfaces of the pair of side portions are inclined inwardly toward each other; the sputtering surfaces of the pair of end portions are inclined inwardly toward each other; and the means for clamping the sputtering target to the target support comprises a peripheral groove formed in the outer edges of the side portion and end portions of the sputtering target, the groove being located closer to the contact surface than the sputtering surface of each of said side portions and end portions, and a clamping member extending alongside the outer edge of each of said side and end target portions, said member comprising an inner edge portion matingly engaging the groove in the outer edge of the corresponding portion of the sputtering target, and no portion of said member penetrating a plane defined by the outer edge of the sputtering surface of the sputtering target.

14. A magnetron cathode assembly according to claim 13 wherein said peripheral groove in the outer edges of the side and end portions of the sputtering target comprises a V-shaped groove having one side that intersects the contact surface and another side that intersects the outer edge of the corresponding one of the side and end portions of the sputtering target, the angle of intersection of said one side of the groove in each of said side and end portions with the contact surface of said portion being equal to the angle of inclination of said portion of the sputtering target with respect to a plane defined by the outer edges of the sputtering surface of the target.

15. A sputtering target for use in a magnetron cathode assembly of a sputtering apparatus, the target comprising a pair of parallel elongated side portions joined by a pair of end portions to form a rectangular frame-like member, each side portion and end portion having an approximately flat sputtering surface composed of a material to be sputter deposited on a substrate, a substantially flat contact surface parallel to the sputtering surface, and parallel inner and outer edges extending between the sputtering surface and the contact surface, the inner and outer edge of each side portion joining with the inner and outer edge of each end portion to form resective inner and outer edges of the rectangular frame, wherein the sputtering surfaces of the side portions are inclined toward each other, the sputtering surfaces of the end portions are inclined toward each other, an inner peripheral groove is formed in the inner edge of the rectangular frame midway between the sputtering surface and the contact surface of each side and end portion, and an outer peripheral groove is formed in the outer edge of the rectangular frame, the outer peripheral groove being located closer to the contact surface than to the sputtering surface.

16. A sputtering target according to claim 15 wherein the inner and outer grooves are V-shaped in cross-section.

17. A sputtering target according to claim 15 wherein the outer peripheral groove of each of the side and end portions has one sidewall that intersects the contact surface at an angle equal to the angle between the sputtering surface and a plane defined by the outer edges of the sputtering surfaces of all the side and end portions of the sputtering target.

18. A sputtering target according to claim 17 wherein the pair of side portions and the pair of end portions are separate pieces having mating ends fitting together to form said rectangular frame.

19. A sputtering target according to claim 17 wherein the pair of side portions and the pair of end portions form a unitary monolithic target frame.

* * * * *

UNITED STATES PATENT AND TRADEMARK OFFICE
CERTIFICATE OF CORRECTION

PATENT NO. : 4,428,816

DATED : 31 January 1984

INVENTOR(S) : Walter H. CLASS et al.

It is certified that error appears in the above—identified patent and that said Letters Patent is hereby corrected as shown below:

Column 8, line 25: after "to" insert --8.6 kA/Min--.

Column 8, line 25: Begin new paragraph with "Plot 62".

Signed and Sealed this

Twenty-second Day of May 1984

[SEAL]

Attest:

GERALD J. MOSSINGHOFF

Attesting Officer    Commissioner of Patents and Trademarks